United States Patent [19]

Mackenzie et al.

[11] Patent Number: 4,591,810

[45] Date of Patent: May 27, 1986

[54] PULSE WIDTH MODULATOR FOR ELECTRONIC WATTHOUR METERING

[75] Inventors: Raymond W. Mackenzie, Pittsburgh; Theodore M. Heinrich, Murrysville, both of Pa.

[73] Assignee: Westinghouse Electric Corp., Pittsburgh, Pa.

[21] Appl. No.: 590,110

[22] Filed: Mar. 19, 1984

[51] Int. Cl.[4] ............................................. H03K 7/00
[52] U.S. Cl. .................... 332/9 R; 324/107; 324/118; 324/142; 332/9 T; 375/22
[58] Field of Search ............. 324/107, 111, 118, 142; 332/9 R, 9 T, 11 D; 375/22, 27, 28, 29

[56] References Cited

U.S. PATENT DOCUMENTS

| | | | |
|---|---|---|---|
| 4,182,983 | 1/1980 | Heinrich et al. | 324/142 |
| 4,250,552 | 2/1981 | Elms | 364/483 |
| 4,315,212 | 2/1982 | Gamoh | 324/142 |
| 4,368,424 | 1/1983 | Miller | 324/142 |

Primary Examiner—Eugene R. LaRoche
Assistant Examiner—James C. Lee
Attorney, Agent, or Firm—William D. Lanyi

[57] ABSTRACT

A pulse width modulator for an electronic kilowatt-hour meter includes an integrator having its inputs connected to a square wave clock signal and a sine wave signal proportional to the time derivative of current on the metered circuit. A plurality of series-connected inverters are connected to the output of the integrator to function as a comparator which generates a pulse width modulated signal having a duty cycle proportional to metered current. A negative feedback path including a low pass filter is connected between the output of the last inverter and an input to the integrator to compensate for errors produced by the integrator and inverters, thus permitting the use of low cost inverters fabricated on an integrated circuit.

6 Claims, 13 Drawing Figures

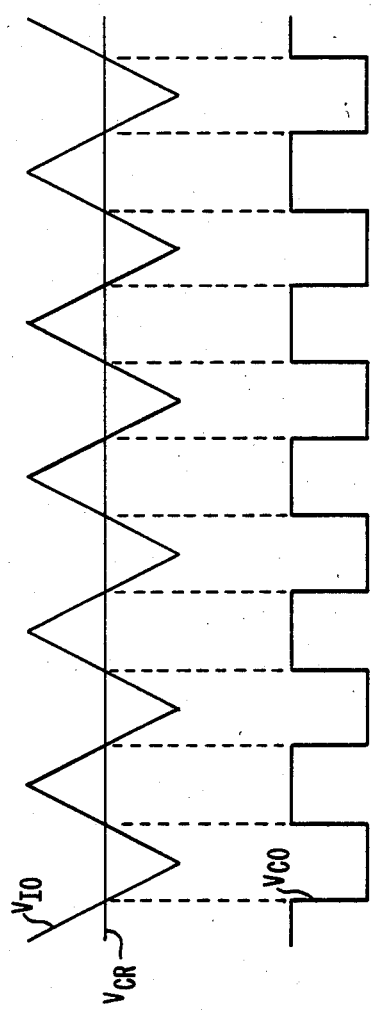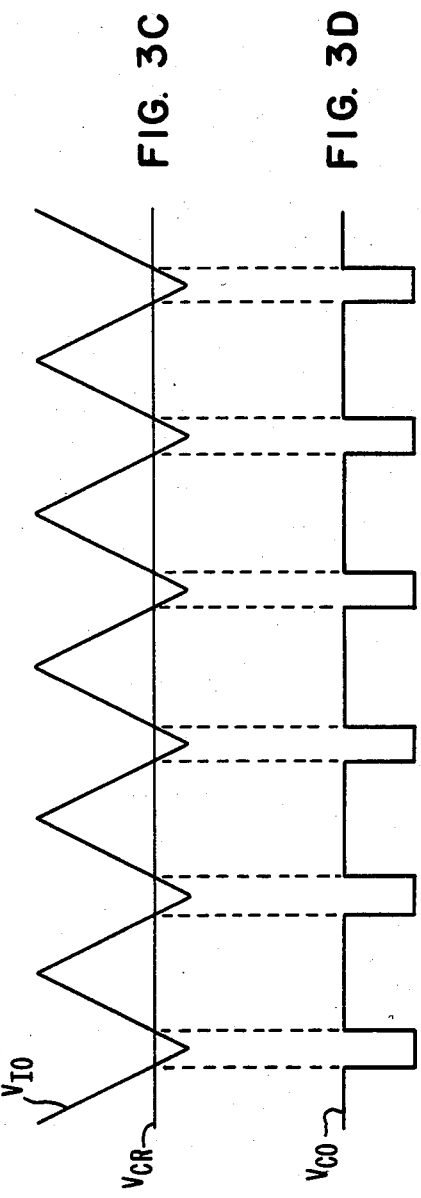

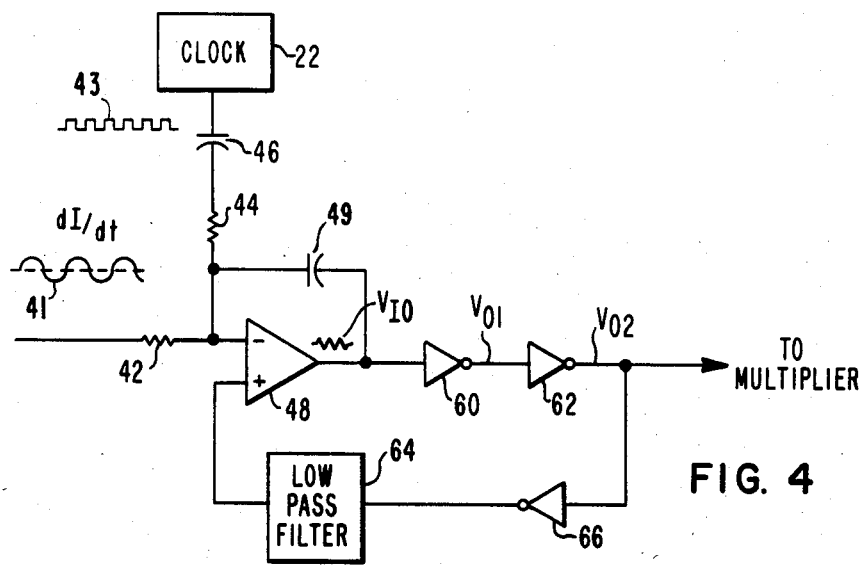
FIG. 4
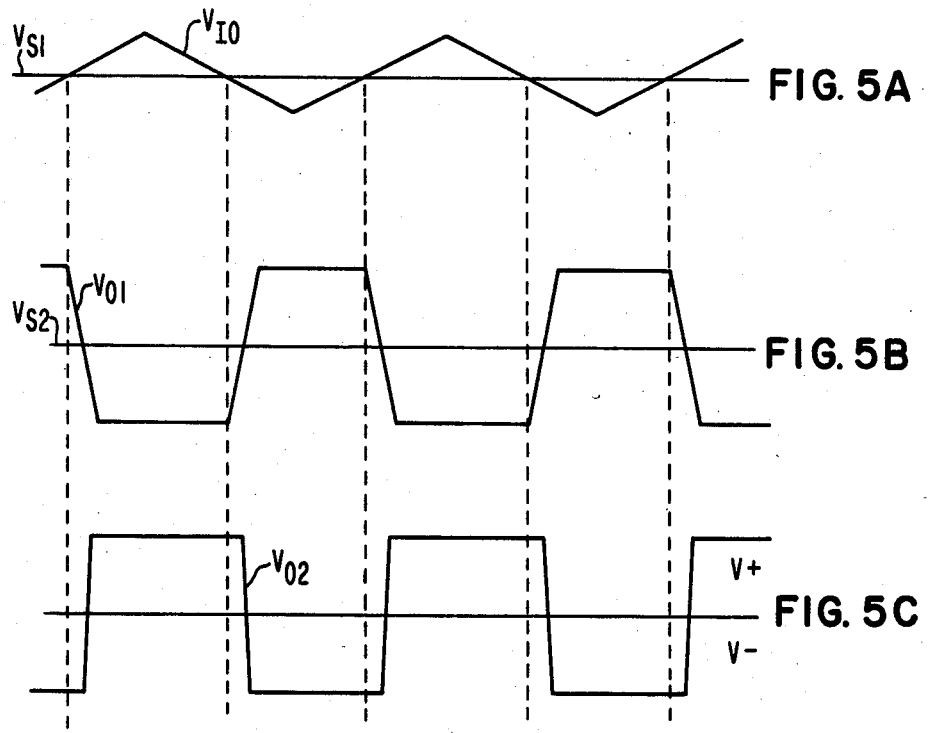
FIG. 5A
FIG. 5B
FIG. 5C

PULSE WIDTH MODULATOR FOR ELECTRONIC WATTHOUR METERING

BACKGROUND OF THE INVENTION

1. Field of the Invention

The invention relates to apparatus for electronic watthour metering and, more particularly, to an improved pulse width modulator especially suitable for incorporation into an integrated circuit.

2. Description of the Prior Art

Several methods are known for electronic watthour metering. One method described in U.S. Pat. No. 4,182,983 employs a mutual inductance current transducer to provide a signal which is proportional to the derivative of the current in the circuit being measured. This current derivative signal is supplied as an input to a circuit that produces a pulse width modulated (PWM) signal having a duty cycle that is proportional to current in the metered circuit. The PWM signal is used to control an electronic switch, the input of which is supplied with a signal proportional to voltage on the metered circuit. The output of the switch provides a signal that is proportional to the product of the current and voltage of the metered circuit. The product signal is then supplied to a voltage-to-frequency converter to produce a train of pulses, wherein each pulse represents the consumption of a predetermined quantum of electric energy. The pulses are accumulated to provide a measure of watthours of energy consumed on the metered circuit.

A somewhat simillar technique is employed in apparatus described in U.S. Pat. No. 4,315,212, in which a signal that is proportional to voltage, rather than current, is applied to a PWM circuit having an integrator and a comparator including a feedback loop to produce a PWM signal having a duty cycle proportional to voltage on the metered circuit. It is desirable to provide a PWM circuit with reduced output asymmetry which is amenable to implementation in an integrated circuit configuration.

SUMMARY OF THE INVENTION

An improved pulse width modulator includes means for providing a triangular-shaped reference signal and a signal proportional to the quantity being measured. A summing circuit is provided to produce a summation signal which is proportional to the instantaneous sum of the triangular reference signal and the measured quantity signal.

A plurality of series-connected digital inverters are provided, with the first inverter having an input connected to the output of the summing means and being biased so as to switch its output state at approximately the midpoint of the triangle signal. Thus, the output of the last of the inverters provides a digital signal having a duty cycle proportional to the measured quantity signal. A negative feedback circuit provides a portion of the signal present at the output of the last inverter to the input of the summing means, and a low pass filter is connected in series with the feedback circuit such that only DC components of the output signal are provided through the feedback circuit to the input to the summing means. The combination of the feedback circuit and digital inverters provides a pulse width modulator apparatus less susceptible to errors which can be caused by offset voltages in active electronic devices of the circuit, yet which is easily implemented by known techniques in an intergrated circuit.

BRIEF DESCRIPTION OF THE DRAWINGS

FIGS. 3A–3D are waveform diagrams of output signals produced under various conditions by a pulse width modulator used in the meter apparatus of FIG. 1;

FIG. 4 is a block diagram of a pulse width modulator constructed according to the principles of the present invention;

FIGS. 5A–5C are waveform diagrams of signals at various stages in the pulse width modulator shown in FIG. 4;

DESCRIPTION OF THE PREFERRED EMBODIMENT

Figure 1:
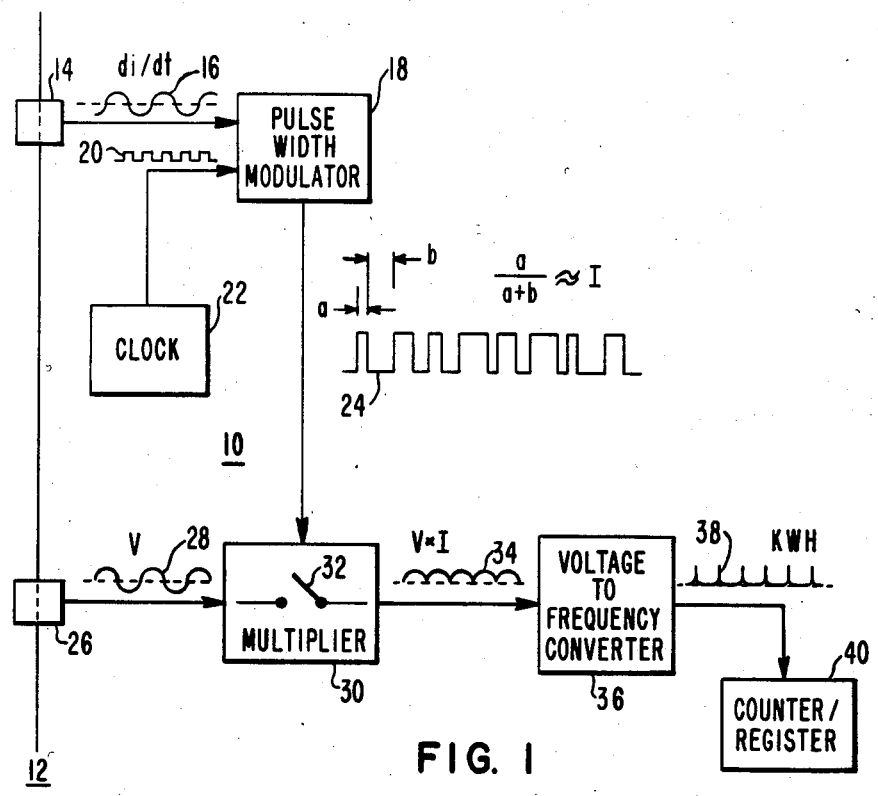
FIG. 1 is a block diagram of an electronic watthour meter device using the pulse height-pulse width modulation technique.

Referring now to the drawings, FIG. 1 shows an electronic kilowatt-hour meter 10 which may employ a pulse width modulator constructed according to the principles of the present invention. The meter 10 is coupled to an electric utility distribution circuit 12 supplying electrical energy to a load, not shown.

A mutual inductance current transducer 14 is coupled to the circuit 12 to produce an output signal 16 proportional to the time derivative of the current in the metered circuit 12. A suitable transducer is disclosed in U.S. Pat. No. 4,368,424.

The current derivative signal 16 is suppled to a pulse width modulator 18 along with a square wave clock signal 20 produced by a clock circuit 22. Alternatively, the function of the clock signal can be internally provided by the pulse width modulation circuit 18 through a self-oscilation process as described in the aforementioned U.S. Pat. No. 4,315,212. The output signal of the pulse with modulator 18 is a pulse signal 24, the duty cycle of which is proportional to the current on the metered circuit 12.

A voltage transducer 26, which may be a conventional potential transformer, provides a signal 28 proportional to voltage on the metered circuit 12. The voltage signal 28 is provided to a multiplier circuit 30 which includes an electronic switch 32, the conductive state of which is controlled by the pulse width modulated signal 24 and is proportional to the metered circuit current. The output of the multiplier circuit 30 is thus a signal 34, the average value of which is proportional to the product of the current and voltage on the metered circuit 12. This product signal 34 is supplied as input to a voltage-to-frequency converter 36, to produce an output signal 38 consisting of a train of pulses, each of which represents the consumption of a predetermined quantum of electric energy (e.g., one kilowatt-hour) by a load connected to the metered circuit 12. The pulse signals 38 are then accumulated for display or subsequent read-out in a counter/register 40.

Figure 2:
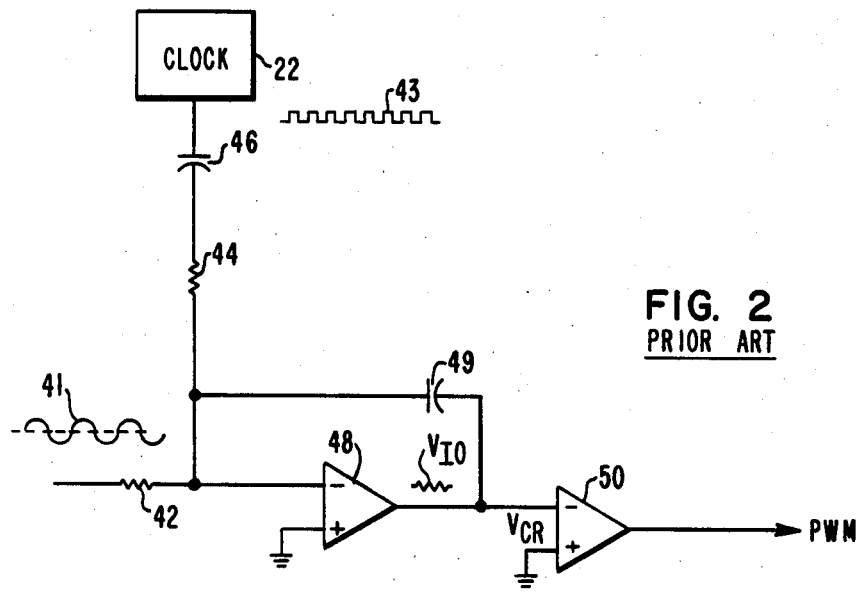
FIG. 2 is a block diagram of a pulse width modulator constructed according to the principles of the prior art which is suitable for use in the meter shown in FIG. 1.

A block diagram of the pulse width modulator 18 as implemented in the prior art is shown in FIG. 2. The input signal 41 in the form of a sine wave, is supplied through a first summing resistor 42. Similarly, the clock signal 43, which is a square wave at a higher frequency than the input signal 41, is supplied through another summing resistor 44 and coupling capacitor 46 to the inverting input of a summing amplifier and integrator 48. The output of the integrator 48 is a signal which is the instantaneous sum of the integral of the square wave clock signal and the sine wave input signal. This signal takes the form of a triangular wave oscillating about a much lower frequency sine wave. The output signal of the integrator 48 is designated as $V_{IO}$.

The signal $V_{IO}$ is supplied to the inverting input of a comparator 50, the non-inverting input of which is grounded. Thus, the comparator 50 will switch output states when the input signal $V_{IO}$ crosses zero volts. The output of the comparator 50 will, of course, assume one of two possible states, depending upon whether the input signal to its inverting input is above or below the reference voltage appearing at the non-inverting input.

The waveforms of the input and output voltages to the comparator 50 for various conditions are shown in FIGS. 3A-3D. FIG. 3A shows the input voltage $V_{IO}$ for the condition wherein the value of the current derivative signal 16 input to the integrator 48 is zero. As can be seen in FIG. 3A, the voltage $V_{IO}$ is a triangle wave which is symmetrical with respect to the comparator reference voltage $V_{CR}$. The signal $V_{IO}$ as shown in FIG. 3A produces an output waveform $V_{CO}$ from the comparator 50 as shown in FIG. 3B. As can be seen therein, the waveform of the signal $V_{CO}$ under conditions of zero current derivative input to the pulse width modulator circuit 18 is a square wave having a 50% duty cycle.

In the presence of a positive input signal to the pulse width modulator 18, the resultant output signal $V_{IO}$ of the integrator 48 appears as shown in FIG. 3C. It can be seen therein that the triangle wave is no longer symmetrical with respect to the comparator reference voltage $V_{CR}$. Whenever the voltage $V_{IO}$ is above the reference voltage $V_{CR}$, the output voltage $V_{CO}$ of the comparator 50 assumes a logic high state. Correspondingly, whenever the voltage $V_{IO}$ is below the comparator reference voltage $V_{CR}$, the comparator output voltage $V_{CO}$ assumes a logic low condition. This can be seen clearly in FIG. 3D. The duty cycle of the output signal from the comparator 50 of the pulse width modulator 18 is thus proportional to the current flowing in the metered circuit 12.

Performance of a pulse width modulator constructed according to the prior art as shown in FIG. 2 is satisfactory in many applications. However, the comparator 50 is a linear circuit, and is thus a relatively expensive item. In applications having a high production volume, such as watthour meters, it is important to reduce the component cost of the completed assembly to as low a value as possible. This is particularly true in polyphase electronic watthour meters, wherein certain components must be duplicated for each phase being measured. The improved pulse width modulator shown in FIG. 4 was developed to provide equivalent performance to the prior art at a reduced cost.

As can be seen in FIG. 4, the inverting input of the integrator 48 is supplied with a sine wave current derivative signal 41 through a summing resistor 42 and with a square wave clock signal 43 from a clock circuit 22 through a summing resistor 44 and coupling capacitor 46 in the same manner as in the prior art. Similarly, the output signal $V_{IO}$ of the integrator 48 is a triangular-shaped wave oscillating about a sine wave proportional to the current flowing in the metered circuit. The integrator output signal $V_{IO}$ is supplied to a string of inverters, such as the inverters 60 and 62 shown in FIG. 4. A negative feedback loop is provided from the output of the last inverter 62 of the string back to the input of the summing amplifier and integrator 48. As shown in FIG. 4, the feedback loop includes a low pass filter 64 and an inverter 66. The feedback is provided to the non-inverting input of the summing amplifier and integrator 48.

The operation of the improved pulse width modulator shown in FIG. 4 may be more readily understood by reference to the waveform diagram shown in FIGS. 5A-5C. As was the case for the prior art pulse width modulator, the output signal $V_{IO}$ of the integrator 48 consists of a triangular-shaped wave which is the integration of the square wave clock signal oscillating about a lower frequency sine wave which is the integration of the current derivative signal. Since the clock signal is typically of much higher frequency than the input signal, a short segment of the sine wave portion of the output signal $V_{IO}$ of the integrator 48 approximates a straight line, and the composite output signal $V_{IO}$ thus appears generally as shown in the graph of FIG. 5A. The reference level of the waveform of FIG. 5A is the switching voltage $V_{S1}$ of the first inverter 60 shown in FIG. 4. Waveform 5B represents the output voltage $V_{O1}$ of the first inverter 60. The reference voltage of waveform 5B is the switching point $V_{S2}$ of the second inverter 62. Finally, waveform 5C represents the output voltage $V_{O2}$ of the second inverter 62.

As can be seen in FIGS. 5A-5C, when the output voltage $V_{IO}$ of the integrator 48 rises above the switching voltage $V_{S1}$ of the first inverter 60, the output voltage $V_{O1}$ of the inverter 60 switches from a high level output to a low level output over a finite switching time. That is, the slope of the output voltage $V_{O1}$, while steep, is not infinite, and thus provides the waveform approximated in FIG. 5B. Similarly, when the output voltage $V_{O1}$ of the first inverter 60 falls below the switching voltage $V_{S2}$ of the second inverter 62, the output voltage $V_{O2}$ of the second inverter 62 switches from a low level to a high level state. The slope of the waveform of FIG. 5C is, of course, much steeper than that of 5B, and closely approximates a square wave.

Of course, with low cost inverters the switching points may not be well defined, and accordingly, a symmetrical triangular waveform such as shown in 5A may not necessarily produce the corresponding symmetrical 50% duty cycle square wave shown in 5C. Therefore, a feedback loop is provided from the output of the last inverter 62 back to the input of the summing amplifier and integrator 48. The inverter 66 provides the proper polarity feedback voltage to the non-inverting input of the integrator 48. The low pass filter 64 is provided so that the modulating signal (that is, the input signal which is proportional to the derivative of current in the metered circuit) will not be present in the feedback signal to the integrator 48. The feedback signal thus includes essentially only the DC component of the signal present at the output of the last inverter 62. The amplitude of the feedback signal is selected so that the output signal $V_{O2}$ of the last inverter 62 is a square wave having a 50% duty cycle when the value of the current derivative input signal 16 is zero.

The feedback loop shown in the device of FIG. 4 provides compensation for errors produced within the loop, including offset voltages, offset currents, and unequal delay times for positive-going versus negative-going signals. Similarly, ill-defined crossover points of the inverters 60, 62, and 66 will also be compensated for. This permits the use of inexpensive components in the pulse width modulator of FIG. 4, significantly reducing the cost, especially for polyphase applications.

Figure 6:
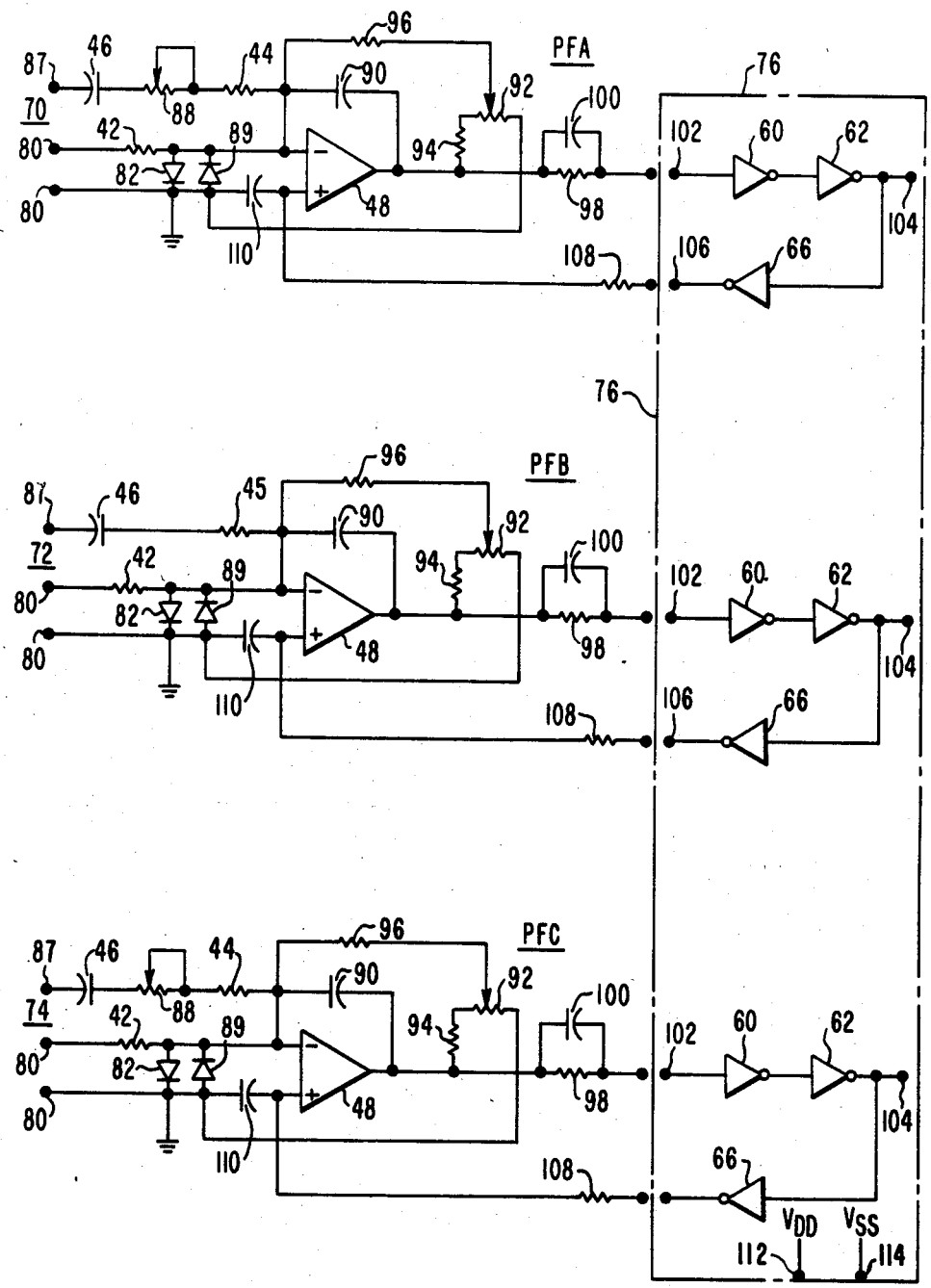
FIG. 6 is a schematic diagram of the pulse width modulator shown in FIG. 4 for use in a three-phase electronic kilowatt-hour meter.

A detailed electrical schematic diagram of a preferred embodiment of the pulse width modulator of FIG. 4 is shown in FIG. 6. A pulse width modulator suitable for use in a three-phase kilowatt-hour meter employing a digital integrated circuit is shown. Components of FIG. 6 which perform functions identical to that shown in FIG. 4 are identified by the same reference characters.

FIG. 6 shows three separate identical summing amplifier and integrator circuits 70, 72, and 74, each connected to a custom integrated circuit 76. The integrated circuit 76 is manufactured by the Micro Circuit Corporation and includes a large number of separate electronic devices fabricated on a common substrate. In utilizing an integrated circuit of this type, the user specifies which of the multitude of devices on the semi-finished chip he wishes to employ. The user also specifies the desired interconnections between those devices, and the manufacturer supplies the finished chip to the user according to those specifications. The circuit 76 employs the CMOS process.

Since the summing amplifier and integrator circuits 70, 72, and 74 are substantially identical, only the circuit 70 will be described in detail. A separate mutual inductance current transducer 14 is provided for each phase of a three-phase distribution circuit (not shown in FIG. 6) carrying electric energy to be measured. The output signal of the transducer 14 is a sine wave at the power line frequency of 60 Hz, which is proportional to the time derivative of the current through one phase of the distribution circuit. The output of the transducer 14 is supplied to input terminals 80, one of which is connected to circuit ground. The summing resistor 42 is connected between the ungrounded input terminal 80 and the anode of a protective diode 82, the cathode of which is grounded. Another protective diode 89 is connected with opposite polarity to the same points. The diodes 82 and 89 provide protection against transient high voltage pulses which may appear across the output of the current transducers 14. The ungrounded terminals of both diodes 82 and 89 are connected to the inverting input of an operational amplifier which comprises the summing amplifier and integrator 48.

A clock circuit, not shown in FIG. 6, provides a square wave clock signal at a frequency of 683 Hz to a terminal 87. The clock signal is coupled through a capacitor 46 to one terminal of a variable resistor 88, provided for two of the three circuits 70, 72, and 74 to provide balance adjustments. The other terminal of the variable resistor 88 is connected to one terminal of the summing resistor 44, the other terminal of which is also connected to the inverting input of the amplifier 48. The values of the components are selected so that the peak-to-peak amplitude of a signal from the clock circuit 22 is equal to the peak-to-peak amplitude of the current derivative signal at the maximum full-scale value of current to be measured in the circuit 12.

A feedback capacitor 90 is connected between the output of the operational amplifier 48 and the inverting input in order to configure the amplifier 48 as an integrator. Variable resistor 92 and fixed resistors 92 and 96 provide additional feedback for the purpose of introducing a phase shift to compensate for the small phase shift introduced in the potential transformers. This adjustment corresponds to the power factor adjustment of an electromechanicl watthour meter. The output of the operational amplifier 48 is connected through a parallel-connected resistor 98 and capacitor 100 to one terminal 102 of the integrated circuit 76. The terminal 102 is connected to the input of the inverter string consisting of inverters 60 and 62. The output of the inverter 62 is connected to a terminal 104 for subsequent connection to the multiplier circuit 30 shown in FIG. 1.

The terminal 104 is also connected to the input of the inverter 66, the output of which is connected to a terminal 106 on the integrated circuit 76. The terminal 106 is also connected to the low pass filter 64 consisting of resistor 108 and capacitor 110. The junction of the resistor 108 and capacitor 110 is connected to the non-inverting input of the amplifier 48. The other terminal of the low pass filter capacitor is connected to circuit ground.

Figure 7:
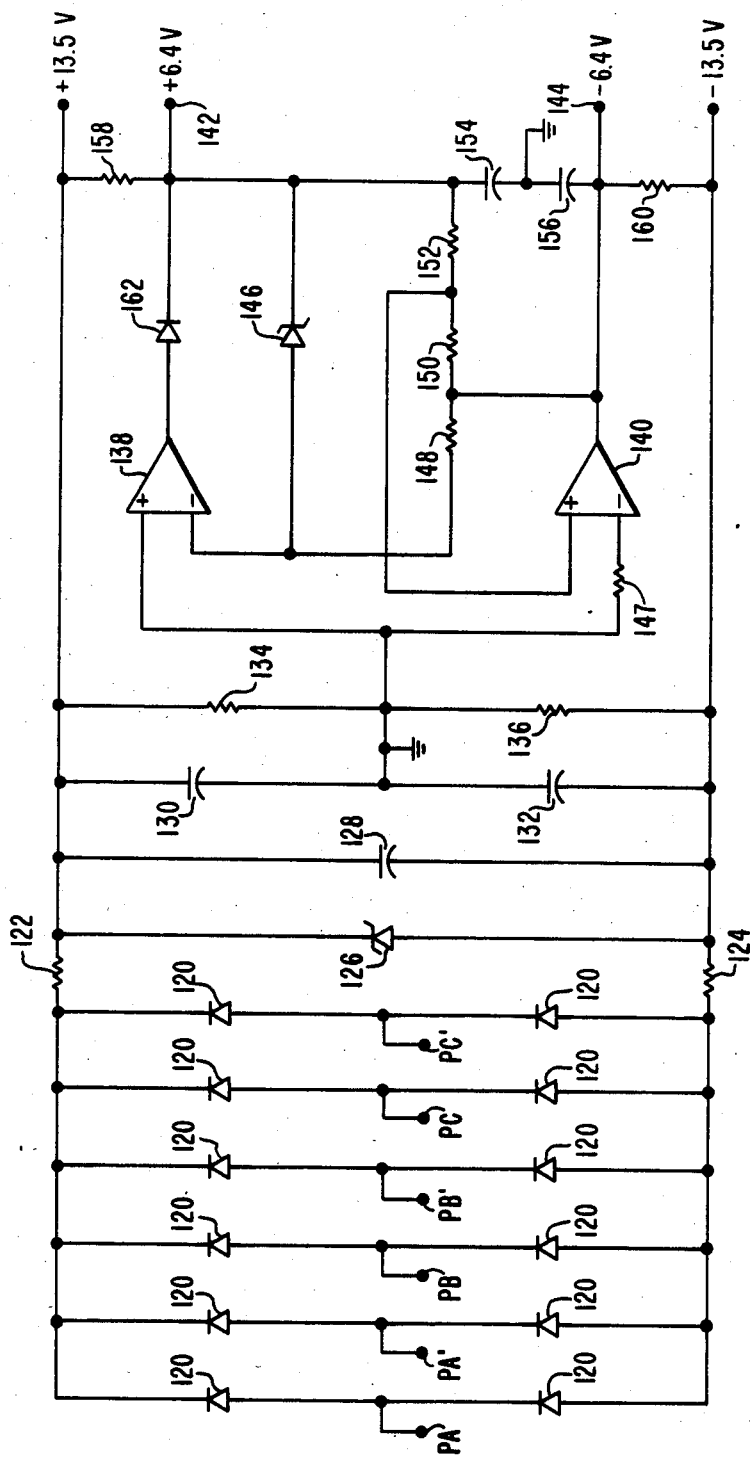
FIG. 7 is a schematic diagram of a power supply which provides a symmetrical waveform for use with the pulse width modulator of FIG. 6.

The integrated circuit 76 also includes power input terminals 112 and 114 which convey supply voltages $V_{DD}$ and $V_{SS}$ from a power supply shown in detail in FIG. 7. It is necessary for proper operation of the present invention that the last inverter of the inverter string, such as the inverter 62 shown in FIGS. 4 and 6, be supplied by a well-balanced power supply in order to insure the necessary degree of output waveform symmetry. Such a power supply is preferably embodied in a bipolar supply such as shown in detail in FIG. 7. The output symmetry of the pulse width modulator is directly proportional to the degree of balance of the power supply.

The circuits 72 and 74 are identical to the circuit 70, with the exception that the circuit 72 does not include the variable resistor 88. Only two such variable resistors are necessary in a three-phase apparatus to supply the necessary degree of balance control. Similarly, the portion of circuitry formed on the chip 76 which is connected to the circuits 72 and 74 is identical to that portion of the chip which is connected to the circuit 70.

Representative values of components shown in FIG. 6 are supplied in Table I below:

TABLE I

| Reference No. | Value |
|---|---|
| 46 | .033 mf |
| 88 | 20K |
| 44 | 150K |
| 82 | Type 1N4148 |
| 84 | Type 1N4148 |
| 48 | Type 074 |
| 90 | .0047 mf |
| 92 | 10K |
| 94 | 1 M |
| 96 | 1 M |
| 98 | 10K |
| 100 | .033 mf |
| 108 | 4.7 M |
| 110 | 2.2 mf |

A suitable power supply for the pulse width modulator of FIG. 6 is shown in FIG. 7. The secondaries of conventional potential transformers connected to phase A, phase B, and phase C of the three-phase circuit 12 are respectively connected to power supply input terminals PA-PA′, PB-PB′, and PC-PC′. A plurality of diodes 120 comprise full-wave bridge rectifiers, the outputs of which are connected to current limiting resistors 122 and 124. A shunt Zener pre-regulator 126 is connected across the output terminals of the resistors 122 and 124. A capacitive filter comprising the capacitors 128, 130, and 132 is connected across the terminals of the pre-regulator 126. The common terminal of the capacitors 130 and 132 is grounded. A pair of balancing resistors 134 and 136 are also connected between the terminals of the pre-regulator 126 and ground, to form a center-tapped power supply. The two terminals of the pre-regulator 126 thus form the power output terminals for a loosely regulated bipolar supply used to power the operational amplifiers 48 which are shown in FIG. 6.

A pair of operational amplifiers 138 and 140 are provided a form a well-regulated bipolar power supply, the output terminals 142 and 144 of which are connected to the terminals 112, and 114, respectively, of the integrated circuit 76. The amplifiers 138 and 140 utilize a temperature-compensated Zener diode 146 as a reference. Associated resistors 148, 150, 152, 158, 160, capacitors 154 and 156, and diode 162 operate with the amplifiers 138, 140 and Zener diode 146 in a conventional manner and will thus not be described in great detail.

Suitable types and values for the components of the power supply of FIG. 7 are shown below in Table II:

TABLE II

| Reference No. | Value |
| --- | --- |
| 120 | 1N4148 |
| 126 | 27 v, 1 W |
| 122 | 56Ω |
| 124 | 56Ω |
| 128 | 330 mf, 30 v |
| 130 | 2.2 mf |
| 132 | 2.2 mf |
| 134 | 10KΩ |
| 136 | 10KΩ |
| 138 | Type 258 |
| 140 | Type 258 |
| 146 | 1N4572A |
| 148 | 6.8KΩ |
| 150 | 6.8KΩ |
| 152 | 6.8KΩ |
| 154 | 2.2 mf |
| 156 | 2.2 mf |
| 158 | 1.8KΩ |
| 160 | 270Ω |

Figure 8:
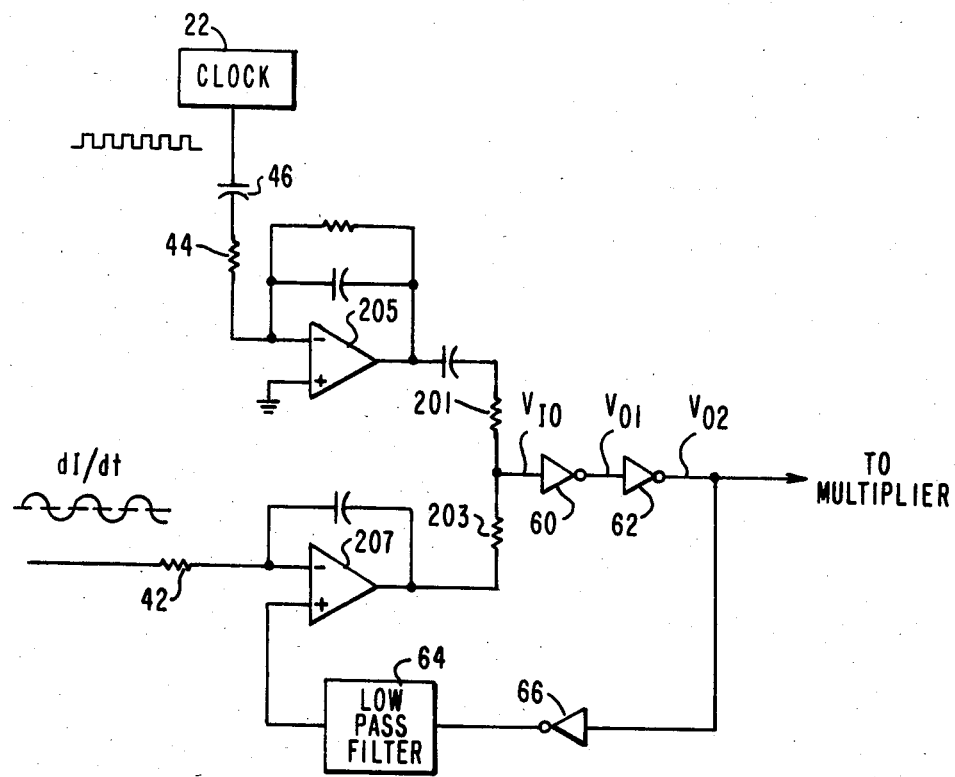
FIG. 8 is a block diagram of a pulse width modulator constructed according to the principals of an alternative embodiment of the present invention.

FIG. 8 illustrates an alternative embodiment of the present invention in which the square wave signal from the clock 22 is first integrated, by an integrator 205, before being added to a signal that is proportional to the quantity being measured. The signal that is proportional to the quantity being measured, the current signal, is provided at the output of an integrator 207 which integrates an input signal which is proportional to the time derivative of the quantity being measured. After the time derivative signal, dI/dt, is integrated to produce a signal proportional to the current and the square wave signal from the clock 22 is integrated to produce a triangular signal, these two signals are added together after passing through summing resistors, 203 and 201, respectively. Both integrators, 205 and 207, are provided with appropriate feedback circuitry. The non-inverting input of integrator 205 is connected to an electrical ground and the non-inverting input of integrator 207 is connected to an output of the low pass filter 64. The combination of the clock 22 and the integrator 205 forms a means for providing a first signal which has a triangular waveform that results from the integration of a square wave. The integrator 207, with its input of a time derivative signal of the current, provides a means for providing a signal that is proportional to he quantity being measured, which is the current. Summing resistors 201 and 203, along with the connection point located therebetween, provides a summing means where the outputs from the two integrators, 205 and 207, can be added together to form a summation signal proportional to the instantaneous sum of the two integrator outputs.

Various modifications could, of course, be made to the pulse width modulator shown in FIGS. 4, 6 and 7 without departing from the spirit of the invention. For example, an extra inverter could be provided in the inverter string as desired to allow connection of the feedback loop to the inverting input of the summing amplifier and integrator 48. Also, digital circuitry from other parts of an electronic meter incorporating the invention could be fabricated on the integrated circuit 76 to provide even greater cost savings.

We claim:
1. Pulse width modulator apparatus comprising:
means for providing a first signal having a triangular waveform;
means for providing a second signal proportional to a quantity being measured;
summing means for providing a summation signal proportional to the instantaneous sum of said first and second signals;
a plurality of series-connected inverters having an input connected to the output of said summing means, the first of said plurality of inverters being biased so as to switch its output state approximately at the midpoint of said first signal in the absence of said second signal, the output of the last of said plurality of inverters providing a pulse signal having a duty cycle proportional to said second signal;
negative feedback means for connecting a portion of the signal present at said inverter output to said summing means; and
a low pass filter connected in series with said feedback means such that only DC components of said output signal are provided to said summing means.

2. Pulse width modulator apparatus comprising:
means for providing a first signal having a square waveform;
means for providing a second signal proportional to a time derivative of a quantity being measured;
summing means for providing a summation signal proportional to the instantaneous sum of said first and second signals;
means for integrating said summation signal;
a plurality of series-connected inverters having an input connected to the output of said integrating means, the first of said plurality of inverters being biased so as to switch its output state approximately at the midpoint of the integral of said first signal in the absence of the integral of said second signal, the output of the last of said plurality of inverters providing a pulse signal having a duty cycle proportional to the integral of said second signal;
negative feedback means for connecting a portion of the signal present at said inverter output to said integrating means; and
a low pass filter connected in series with said feedback means such that only DC components of said output signal are provided to said integrating means.

3. Pulse width modulator apparatus, comprising:

means for providing a summation signal, said summation signal comprising a first signal having a triangular waveform and a second signal being proportional to a quantity being measured;

a plurality of series-connected inverters having an input connected to the output of said providing means, the first of said plurality of inverters being biased so as to switch its output state approximately at the midpoint of said first signal in the absence of said second signal, the output of the last of said plurality of inverters providing a pulse signal having a duty cycle proportional to said second signal;

negative feedback means for connecting a portion of the signal present at said inverter output to said providing means; and a low pass filter connected in series with said feedback means such that only DC components of said output signal are provided to said providing means.

4. The apparatus of claim 8, wherein:

said first signal is formed by integrating a square waveform; and said second signal is formed by integrating a waveform that is proportional to a time derivative of said quantity being measured.

5. The apparatus of claim 3, wherein:

said summation signal is formed by integrating a waveform that is the sum of a square waveform and a sinusoidal waveform, said sinusoidal waveform being proportional to a time derivative of said quantity being measured.

6. The apparatus of claim 3, wherein:

said providing means comprises an operational amplifier configured as an integrator.

* * * * *